United States Patent
Heinemann et al.

(10) Patent No.: US 7,731,433 B1
(45) Date of Patent: Jun. 8, 2010

(54) OPTOELECTRONIC SURFACE-MOUNTED DEVICE AND METHOD FOR FORMING AN OPTOELECTRONIC SURFACE-MOUNTED DEVICE

(75) Inventors: Erik Heinemann, Regensburg (DE); Cyrus Ghahremani, Regensburg (DE); Tobias Stäber, Regensburg (DE)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 12/329,526

(22) Filed: Dec. 5, 2008

(51) Int. Cl.
*G02B 6/36* (2006.01)
*G02B 6/12* (2006.01)

(52) U.S. Cl. .......................... 385/93; 385/88
(58) Field of Classification Search .................. 385/93, 385/88
See application file for complete search history.

(56) References Cited

U.S. PATENT DOCUMENTS

| | | |
|---|---|---|
| 4,625,333 A | 11/1986 | Takezawa et al. |
| 5,337,398 A | 8/1994 | Benzoni |
| 6,071,015 A | 6/2000 | Erbse |
| 6,453,091 B2 | 9/2002 | Kawai |
| 7,036,999 B2 | 5/2006 | Schrodinger |
| 7,192,200 B2 | 3/2007 | Casati |
| 7,371,012 B2* | 5/2008 | Schunk .................. 385/88 |
| 2001/0035573 A1* | 11/2001 | Weigert .................. 257/680 |
| 2004/0008952 A1* | 1/2004 | Kragl .................. 385/88 |

FOREIGN PATENT DOCUMENTS

DE 100 65 624 A1 7/2002

* cited by examiner

*Primary Examiner*—Frank G Font
*Assistant Examiner*—Eric Wong

(57) ABSTRACT

An optoelectronic surface-mounted device is provided comprising a premolded casing having a first cavity and a second cavity and a leadframe to which a first electrooptical element and a second electrooptical element are mounted. The leadframe is embedded in the premolded casing. The first cavity is adapted for providing a first electromagnetic radiation path between a first waveguide and the first electrooptical element, wherein the second cavity is adapted for providing a second electromagnetic radiation path between a second waveguide and the second electrooptical element. The first cavity and the second cavity are formed in the premolded casing to decouple electromagnetic radiation propagating along the first electromagnetic radiation path from electromagnetic radiation propagating along the second electromagnetic radiation path.

12 Claims, 3 Drawing Sheets

OPTOELECTRONIC SURFACE-MOUNTED DEVICE AND METHOD FOR FORMING AN OPTOELECTRONIC SURFACE-MOUNTED DEVICE

TECHNICAL FIELD OF THE INVENTION

The invention relates to an optoelectronic surface-mounted device and a method for making an optoelectronic surface-mounted device.

BACKGROUND OF THE INVENTION

For transmitting audio, video or other data signals by fibre optics or by electric conductors, standardized serial bus systems are known. A standardized serial bus system that is used in particular for interconnecting multimedia components in automobiles or other vehicles, for example, is the media oriented system transport bus (MOST). For data that are transmitted by an optical fibre, a MOST 25 standard is defined, wherein for data that are transmitted by an electrical conductor, a MOST 50 standard is defined, for example.

For transmitting the (multimedia) data by optical fibers, a radiation source for sending the optical data and a detector for receiving the transmitted optical data may be provided. In conventional systems for applying the MOST 25 bus, the radiation sources and the detectors are mounted in separate connectors for connecting the radiation sources or the detectors to a circuit card. Each of the radiator connectors and the detector connectors are formed in conventional systems for providing a connection to the circuit board by a through-hole technology. By connecting the connector with the through-hole technology, the connectors comprise pins that are inserted into holes drilled in the circuit board and soldered to pads on the circuit board on its opposite side. The connectors thereby comprise a leadframe to which an integrated circuit and an electrooptical element are bonded. Thereby, the leadframe is inserted into a plastic housing that is filled with an optical resin.

DE 100 65 624 A1 discloses that in order to precisely align an optical waveguide in relation to an electro-optical component, said electro-optical component is fixed to a submount which can be arranged on any site on a carrier. A coupling element comprising a negative image of the contour of the submount is optionally provided for mounting the optical waveguide. Said coupling element is positively fixed to the submount and receives the end of the optical waveguide. The intermediate region between the electrooptical component and the optical waveguide is filled with a transparent adhesive. The submount can be designed according to microstructure technology. The coupling element is not required if the optical waveguide is directly aligned in relation to the submount.

SUMMARY OF THE INVENTION

The invention is directed to an optoelectronic surface-mounted device that can be connected to a circuit board relatively easily compared to known optoelectronic surface-mounted devices. The invention is also directed to a method for making the optoelectronic surface-mounted device. The optoelectronic surface-mounted device comprises a pre-molded casing having a first cavity and a second cavity, a first electrooptical element and a second electrooptical element, and a leadframe to which the first electrooptical element and the second electrooptical element are mounted. The leadframe is embedded in the premolded casing. The first cavity is adapted for providing a first electromagnetic radiation path between a first waveguide and the first electrooptical element. The second cavity is adapted for providing a second electromagnetic radiation path between a second waveguide and the second electrooptical element. The first cavity and the second cavity are formed in the premolded casing to decouple electromagnetic radiation propagating along the first electromagnetic radiation path from electromagnetic radiation propagating along the second electromagnetic radiation path.

The method comprises providing a premolded casing having a first cavity and a second cavity, mounting a leadframe to a first electrooptical element and a second electrooptical element, embedding the leadframe in the premolded casing, providing a first electromagnetic radiation path between a first waveguide and the first electrooptical element, providing a second electromagnetic radiation path between a second waveguide and the second electrooptical element, and forming the first cavity and the second cavity in the premolded casing to decouple electromagnetic radiation propagating along the first electromagnetic radiation path from electromagnetic radiation propagating along the second electromagnetic radiation path.

These and other features and advantages of the invention will become apparent from the following description, drawings and claims.

DETAILED DESCRIPTION OF ILLUSTRATIVE EMBODIMENTS

Figure 1:
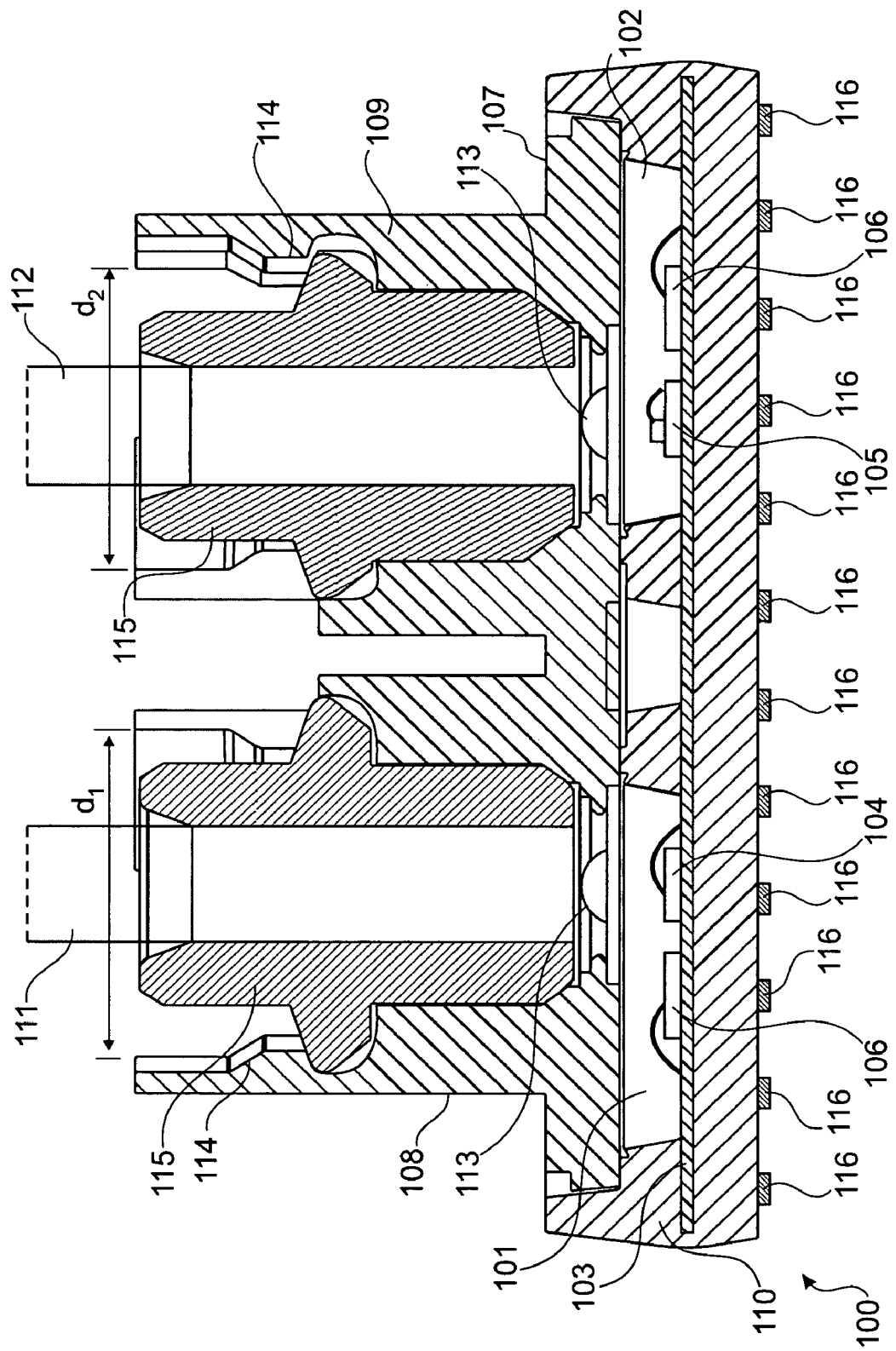
FIG. 1 illustrates an optoelectronic surface-mounted device according to an exemplary embodiment in a sectional view.

In accordance with an illustrative embodiment of the invention, an optoelectronic surface-mounted device (or package) is provided that includes a premolded casing having a first cavity and a second cavity, and a leadframe to which a first electrooptical element and a second electrooptical element are mounted. The leadframe is embedded into the pre-molding casing. The first cavity is adapted for providing a first electromagnetic radiation path (such as a first light path) between a first waveguide (such as a first optical fiber) and the first electrooptical element. The second cavity is adapted for providing a second electromagnetic radiation path (such as a second light path) between a second waveguide (such as a second optical fiber) and the second electrooptical element. The first cavity and the second cavity are formed in the premolded casing to decouple electromagnetic radiation propagating along the first electromagnetic radiation path and the second electromagnetic radiation path. In other words, an optical crosstalk between the first electromagnetic radiation path and the second electromagnetic radiation path may be prevented or suppressed.

The invention also provides a method of forming an optoelectronic surface-mounted device is provided. In accordance an illustrative embodiment, the method comprises providing a premolded casing having a first cavity and a second cavity, mounting a leadframe to a first electrooptical element and a second electrooptical element. The leadframe is embedded into the premolded casing. The method also includes providing a first electromagnetic radiation path between a first waveguide and the first electrooptical element, providing a second electromagnetic radiation path between a second waveguide and the second electrooptical element, and forming the first cavity and the second cavity in the premolded casing to decouple electromagnetic radiation propagating along the first electromagnetic radiation path and the second electromagnetic radiation path.

It should be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this application.

In accordance with an illustrative embodiment, an electrooptical element may be mounted to the leadframe, which is embedded in the premolded casing. The premolded casing may comprise a molded plastic component in which the leadframe structure may be embedded. In particular, the leadframe may be completely embedded into the premolded casing. The premolded casing may be a hollow casing comprising the first cavity and the second cavity in which an electromagnetic radiation path between a waveguide or an optical fibre (or any other optical waveguide) and the electrooptical element mounted to the leadframe may be provided. The aforementioned conventional connectors may be used for connecting the connectors to the circuit board using the aforementioned through-hole technology, and the optoelectronic surface-mounted device of the invention may be connected using known surface mounted technology (SMT).

The premolded casing may be formed, prior to a chip assembly procedure, to provide an accommodation space for receiving various components of the optoelectronic component. A leadframe structure may be inserted into an injection molding device, so that injection molding of a plastic material may embed the leadframe which is then fixedly connected within the casing and still allows for an efficient coupling between components within the premolded casing and components outside of the premolded casing. Thus, according to an exemplary embodiment, a premolded casing for an SMT compatible fiber optic transmitter/receiver module (electrooptical element) may be provided. By using the premolded technology it is possible to implement the components, such as the leadframe or the electrooptical elements, in such a manner that the properties of these components (for instance the functionality of the electrooptical elements) are not negatively influenced by a soldering procedure involving temperatures of 260° C. and greater.

The embedded leadframe (having electrically conductive traces and pins for electrically connecting an interior of the premolded casing with an exterior thereof) may be embedded in the premolded casing. The leadframe may be used for electrically connecting the electrooptical element, such as e.g. an electromagnetic radiation source and/or detector, and/ or an integrated circuit (e.g. a driver circuit) to an external periphery, such a circuit board, a power supply, a signal transmission, etc. In other words, when the optoelectronic element is mounted, for instance in an SMT (Surface Mounted Technology) manner, the leadframe comprising a plurality of electrically conductive traces (or pins) may allow for an external electric contacting by a reflow solder process to the electromagnetic radiation source/detector accommodated within the premolded casing. By forming the premolded casing by injection molding, the costs may be kept low, but also the fiber optic component may withstand the high temperatures of the reflow soldering process of SMT.

In accordance with one illustrative embodiment, the electrooptical element may have an electromagnetic radiation source, such as an infrared, visible, optical or ultraviolet emitting active component. The active component may be, for example, a light emitting diode or a laser diode. Additionally or alternatively, the electrooptical element may comprise an electromagnetic radiation detector, such as a photodiode, for detecting electromagnetic radiation such as visible optical light, infrared radiation or ultraviolet radiation.

In other words, an economically manufacturable electrooptical element may be provided which may serve as a transmitter module (electromagnetic radiation source) for transmitting optical signals in a waveguide or as a receiver (electromagnetic radiation detector) module for detecting optical signals received from a waveguide. Such an optoelectronic element may be manufactured in small dimensions of, for instance, smaller than 2 mm×2 mm×4 mm. The element may be manufacturable with economic leadframe plastic casing technology for microelectronic components and may have, as electrooptical element and/or as electrically active electronic chips, a light emitting diode or a laser chip together with a driver IC as a transmitter, optionally in combination with passive electronic components, devices or chips such as capacitors, inductors or ohmic resistors. In a configuration as a receiver or electromagnetic radiation detector, a photodiode chip and an amplifier IC may be provided, optionally in combination with passive electronic components, devices or chips such as capacitors, inductors or ohmic resistors.

In accordance with another illustrative embodiment, the premolded casing is formed of an opaque material. The term "opaque material", as that term is used herein, is intended to denote a material that has opaque characteristics, i.e. infrared, visible, optical or ultraviolet light may be prevented from being transmitted through the opaque material of the premolded casing. Thus, the optical crosstalk between the first cavity and the second cavity may be prevented by the opaque material of the premolded casing. The opaque material may comprise thermoplastic material, thermoplastic resin or thermosetting resin or thermosetting moulding material. Thus, in order to provide the first cavity and the second cavity without an optical crosstalk, no further opaque elements have to be installed. By choosing an opaque material for the premolded casing, an optical crosstalk between the first electromagnetic radiation path and the second electromagnetic radiation paths of the first cavity and the second cavity may be prevented.

In accordance with another illustrative embodiment, the first cavity and the second cavity are filled with the transparent material. As a material for the transparent medium, it is possible to use silicones or resins that are capable of withstanding temperatures of 300° C. without losing their transparent property. The transparent medium may be casted to fill gaps or volumes with air within a hollow portion of the premolded casing between the components installed therein. Such an optically transparent medium will, due to its optical transparency, not disturb propagation of electromagnetic radiation between fiber and electromagnetic radiation source/ detector and may at the same time ensure a constant optical relationship between the individual optoelectronic components of the optoelectronic component. Thus, the transparent medium may contribute to keep the optical properties constant between the optoelectronic constituents, the deflecting element and the fiber. This means that the optical space between them and their surfaces with optical refractive changing properties may be maintained in a defined manner, during all environmental influences during assembling to the board (SMT processes), operation and storage.

The transparent medium may fill up the first cavity and/or the second cavity, so that upon mounting the waveguide in a mounting opening (e.g. a retainer) a front surface of the inserted waveguide directly abuts against the transparent medium. Such a configuration may allow for a proper optical coupling between waveguide and casing without the need of additional optical components.

When the transparent medium is mechanically flexible, for instance is made from a gel-like material, an abutment of an end face of the fiber to the flexible transparent medium may result in a deformation of the flexible material so that a surface topography of the flexible medium is matched to a rough surface of the fiber (waveguide), thereby allowing for a proper optical coupling without scattering and reflections. By taking this measure, it may be possible to use waveguides even when these have end surfaces which are not completely planar. Consequently, also an unskilled user may install a waveguide within the optoelectronic surface-mounted device without the need of performing a complex adjustment procedure.

In accordance with another illustrative embodiment, the optoelectronic surface-mounted device may further comprise a driver circuit. The driver circuit is connected to the leadframe and to at least one of the first electrooptical elements and the second electrooptical elements. It is further possible to provide a further driver circuit, so that each of the first electrooptical element and second electrooptical element comprise a respective driver circuit. Furthermore, a plurality of driver circuits may be connected to the first electrooptical element and/or the second electrooptical element. The driver circuits may be bonded to the leadframe in order to provide a conductive connection and may furthermore bonded to either the first electrooptical element or the second electrooptical element. Furthermore, the driver circuits may comprise application-specific integrated circuits (ASICs). Such an ASIC (i.e. driver circuit) is an integrated circuit customized for a particularly use, rather than intended for general purpose use. An ASIC may be customized to the need of specific customers, e.g., an ASIC may not be programmable and may only be used for cell phone application or engine control purposes for a vehicle.

It is also possible to mount driver circuits such as a driver IC for an electromagnetic radiation source or an amplifier IC for an electromagnetic radiation detector within the premolded casing close to the electromagnetic radiation source/detector. This may keep electrical paths short, thereby suppressing the generation of artifacts in signals communicated between the individual components. The optoelectronic component according to an exemplary embodiment may be directly used to be mounted on a printed circuit board (PCB) or any other support, for instance by reflow soldering. Due to the construction and the specific material of the premolded casing (package) of the optoelectronic component, it is possible that even the high temperatures during soldering, for instance 260° C. or more, do not deteriorate the performance of the optoelectronic component. Since the described architecture is compatible with the surface mounted technology, it is possible to flexibly fasten the optoelectronic component at any desired printed circuit board (PCB), thereby allowing for the production of optoelectronic systems with low cost.

In accordance with another illustrative embodiment, at least one of the first electrooptical elements and the second electrooptical elements is selected from the group consisting of electromagnetic radiation sources and electromagnetic radiation detectors. Thus, the optoelectronic surface-mounted device may comprise a plurality of electromagnetic radiation sources or a plurality of electromagnetic radiation detectors, so that more data may be transmitted simultaneously. Furthermore, when the first electrooptical element is an electromagnetic radiation source and the second electrooptical element is an electromagnetic radiation detector, a sender/receiving device (transceiver) may be provided. Thus, an optoelectronic surface-mounted device for being mounted by the SMD-technology may be provided. Due to the design of the cavities, a distracting cross talk between the first light electromagnetic radiation path and the second electromagnetic radiation path may be prevented, so that an undisturbed transmission of the optical data may be provided.

In accordance with another illustrative embodiment, the optoelectronic surface-mounted device further comprises a cap element having a first retainer and a second retainer. The first retainer and the second retainer are adapted for retaining the first waveguide and the second waveguide in a predetermined position with respect to the first electrooptical element and the second electrooptical element, so that the first electromagnetic radiation path and the second electromagnetic radiation path is provided and generated. By providing the cap element, the premolded casing comprising the leadframe, the first and second electrooptical elements and e.g. a driver circuit may be prefabricated and finalized by attaching the cap element to the premolded casing. Thus, independent of the premolded casing, a cap element may be produced, wherein the retainers may be adapted to a variety of different connectors (e.g., ferrules) of waveguides (e.g. optical fibers). Thus, the optoelectronic surface-mounted device, and in particular the premolded casing, may be produced independent from the geometrical specifications (diameters, length) of the connectors of the waveguides. Thus, the optoelectronic surface-mounted device is adaptable to a variety of different customer specifications without a fundamental redesign of e.g. the premolded casing or the leadframe.

A waveguide access retainer may allow for accommodating a properly dimensioned fiber such as a glass fiber or a polymer optical fiber (POF) (for instance having a diameter of up to 1 mm). Alternatively, a fiber bundle (for instance having a diameter of up to 1 mm) formed by a plurality of thin individual fibers can be accommodated within the retainer. This may allow for an efficient coupling of light into (or out of) the premolded casing to (or from) the active chip accommodated therein. It is possible that the fiber axis extends parallel to the mounting plane (electrical contact plane) of the component. Thus, a simply pluggable and fixable fiber connection may be made possible in combination with a small height of the component (for instance less than 2 mm) so that an efficient coupling of light between active chip and a fiber is possible without the need of performing an active adjustment of individual components.

In accordance with another illustrative embodiment, the optoelectronic surface-mounted device further comprises a lens element, wherein the lens element is mounted at least to the first retainer and to the second retainer. The electromagnetic radiation may be bundled by the lens so that the radiation transfer may be more effective. Thus, the transmitted electromagnetic radiation, either radiated by the electromagnetic radiation source or transmitted by the waveguide to the electromagnetic radiation detector may be amplified and multiplexed by the lens, so that the quality of the signal transmitted by the electromagnetic radiation may be improved.

In accordance with another illustrative embodiment, the lens element is mounted to at least one of the first retainer and the second retainer, so that the lens element may extend into one of the first cavity and the second cavity. Thus, when the lens extends into the first cavity and/or the second cavity, the distance between the radiation source and/or the detector may be shortened, so that a diffusion or scattering of the light between the waveguide and the first and second electrooptical element may be reduced. Thus, the quality of the light signal that has to be transmitted and thus the optical coupling may be improved. Furthermore, by an extension of the lens into the first and the second cavity, the lens may be dipped or soaked into the transparent material filled in the first cavity and the second cavity. Thus, when the lens and thus the waveguide is in physical contact (with index matching) with the transparent material, the optical boundary properties between the transparent material and the waveguide may be improved. This makes it possible to use waveguides that do not have perfect surface properties without the danger of losing too much light intensity by scattering and/or reflection.

Furthermore, the lenses may comprise molded lenses that may consist of silicon, for instance. Other materials, such as hyaline or glass-like lenses may also be used for this purpose.

In accordance with another illustrative embodiment, the first retainer and the second retainer are shape coded, so that the first retainer is adapted for receiving the first waveguide and the second retainer is adapted for receiving the second waveguide. The term "shape coded", as that term is used herein, is intended to denote a geometrical characteristic of one of the retainers, wherein the geometry of the retainers is adapted to a geometry of a connector (ferrule) of the waveguides, so that only the waveguide with the matching geometry may be fixed to the respective retainer. The geometrical coding may be provided by an alignment of the diameters of the retainers. Furthermore, the retainers may comprise in constant geometries, such as tapered surfaces, beads or flaring. Thus, the optoelectronic surface-mounted device may also be used in devices that are operated by unskilled persons due to a prevention of false connection of waveguides to the respective retainers.

The mounting of the waveguide may be performed at a user's side or at a factory side. Consequently, the optoelectronic component may be installable in a flexible manner anywhere for any field of application.

In accordance with another illustrative embodiment, at least one of the first retainer and the second retainer is configured with a geometry that enables it to receive snap fit connectors or bayonet nut connectors of the first waveguide or the second waveguide. A connector of a waveguide may be, for example, a ferrule. When providing a snap-fit connection, the ferrule may comprise a snap element that may be snapped into a respective reception of the retainer for providing a defined retaining position of the waveguide. By using a bayonet nut connector a bayonet mount may be provided. The retainer may be formed with one or more pins or slots wherein the ferrule or the connector of the waveguide may be a female comprising receptors with matching slots or matching pins and furthermore a spring that contains a clamping force. Thus, standardized connections may be used for providing a fastening mechanism between the retainers and the fibres that are standardized so that an easy and inexpensive production method may be provided.

In accordance with another illustrative embodiment, the leadframe comprises a footprint selected from one of the groups consisting of SOIC 8 footprints, SOIC 16 footprints, SOIC 24 footprints and SOIC 32 footprints. By the term SOIC (small-outline integrated circuit) a leadframe may be defined that comprises a defined amount of connecting keys or pins to a circuit board. An SOIC footprint may be standardized. The SOIC 8 footprints may comprise 8 connecting pins, the SOIC 16 footprint may comprise 16 connecting pins, the SOIC 24 footprint may comprise 24 connecting pins and the SOIC 32 may provide 32 connecting pins.

The illustrative embodiments will now be described with reference to FIGS. 1 and 2. FIG. 1 illustrates a cross-sectional view of an optoelectronic surface-mounted device 100 according to an illustrative embodiment. The optoelectronic surface-mounted device 100 includes a premolded casing 110 having a first cavity 101 and a second cavity 102. Furthermore, the optoelectronic surface-mounted device 100 comprises a leadframe 103 to which a first electrooptical element 104 and a second electrooptical element 105 may be mounted. The leadframe 103 is embedded in the premolded casing 110. The first cavity 101 is adapted for providing first electromagnetic radiation path between a first waveguide 111 and the first electrooptical element 104. The second cavity 102 is adapted for providing a second electromagnetic radiation path between a second waveguide 112 and the second electronic element 105. The first cavity 101 and the second cavity 102 are formed in the premolded casing 110, so that an optical crosstalk between the first electromagnetic radiation path and the second electromagnetic radiation path is prevented.

Figure 3C:
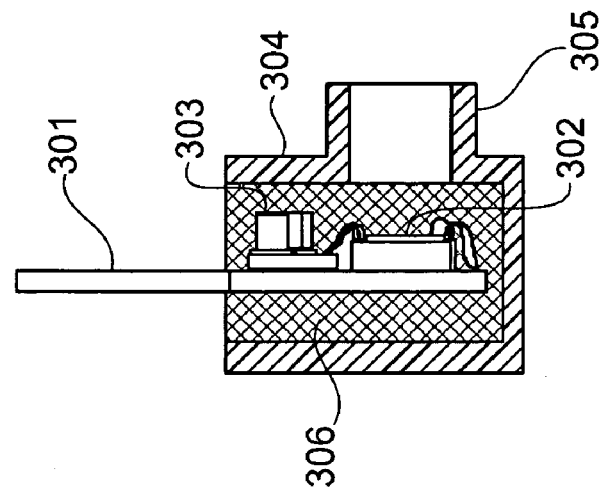
FIGS. 3A-3C illustrate a conventional optoelectronic connector.
Figure 3B:
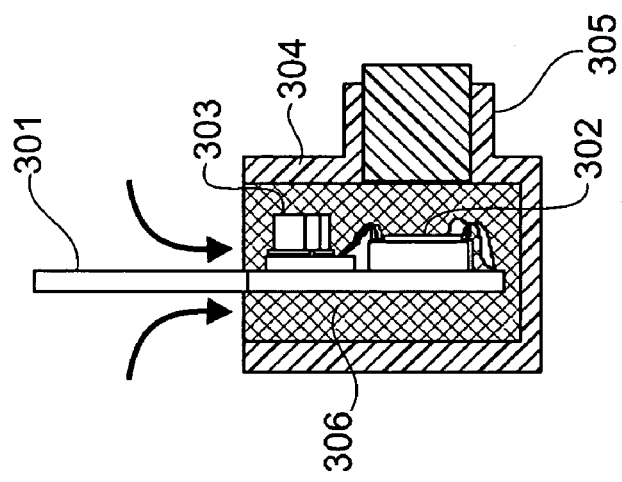
Figure 3A:
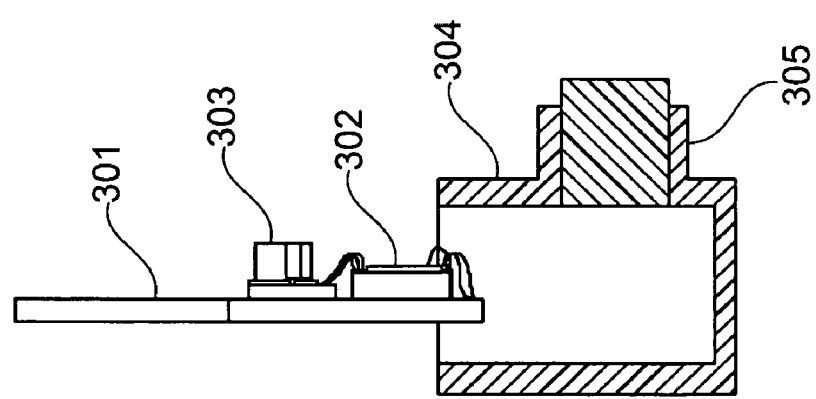

FIGS. 3A-3C illustrate a conventional optoelectronic connector, which will be used for comparison purposes. A conventional leadframe 301 is attached to a conventional electronic element 302 and a conventional driver circuit 303 by wire bonds. The conventional leadframe 301 may be guided into the inside of a casing 304. The casing 304 provides an opening 305 through which an electromagnetic radiation path may be provided between the outside of the casing 304 and a waveguide, for instance. The conventional leadframe 301 is attached to the inside of the casing 304, and embedded with a liquid resin. Until the resin is cured, the conventional leadframe 301 has to be kept in position, so that no dislocation with respect to the casing 304 occurs. Furthermore, the opening 305 is closed by a plug until the resin is cured. When the resin is cured, the plug will be removed from the opening 305 (FIG. 3c). This may affect the production time of the connector because the connector may not be processed further until the resin is hardened and cured.

Furthermore, the resin that fixes the conventional leadframe 301 in position with respect to the casing 304 changes its consistency under the influence of temperature changes, so that also a displacement of the conventional leadframe 301 with respect to the casing 304 occurs. Furthermore, the resin is susceptible to weathering (e.g. heat aging).

With reference again to FIG. 1, in comparison to the conventional device shown in FIGS. 3A-3C, the leadframe 103 of the optoelectronic surface-mounted device (package) 100 is embedded in the premolded casing 110 so that no dislocation of the leadframe 103, and thus no dislocation of the electrooptical elements 104, 105, with respect to the waveguides 111, 112, occurs. Furthermore, during the production process, the leadframe 103 is already fixed to premolded casing 110, so that no holding times for the curing or hardening of the resin may be necessary.

The premolded casing 110 may be molded around the leadframe 103. The first electrical electrooptical element 104 and the second electrooptical element 105 are connected to the leadframe 103. The first electrooptical element 104 and the second electrooptical element 105 may be glued or wire bonded to the leadframe 103. Furthermore, a driver circuit 106 may be attached to the leadframe 103 by, for instance, an adhesive means and/or by wire bonding in order to provide an electrical connection. The first electrooptical element 104 and/or the second electrooptical element 105 may be adapted for transferring optical light data from the first waveguide 111 or the second waveguide 112 into digital (electrical) data and transmit the digital data to the driver circuit 106. Furthermore, the first electrooptical element 104 and the second electronic element 105 may receive digital (electrical) data from the driver circuit 106 and transform the digital data into optical data and transmit the optical data to the first waveguide 111 or the second waveguide 112. Thus, the first electrooptical element 104 and/or the second electrooptical element 105 may consist of an electromagnetic radiation source and/or an electromagnetic radiation detector of light received from the waveguides 111, 112.

The first electrooptical element 104 and the second electrooptical element 105 are located relative to the leadframe 103 in such a way that light (optical data) may be guided through the first cavity 101 and the second cavity 102 to or from the first waveguide 111 and the second waveguide 112. The terms "first electromagnetic radiation path" and "second electromagnetic radiation path" may describe a path of the electromagnetic radiation between the waveguides 111, 112 through the cavities 101, 102 and to the electrooptical elements 104, 105. The first cavity 101 and the second cavity 102 may be arranged in the premolded casing 110 in such a way that no electromagnetic radiation path between the first cavity 101 and the second cavity 102 is provided, i.e. a cross talk may thus be prevented. Therefore, the premolded casing 110 may consist of an opaque material, so that a light transmission (optical crosstalk) may be prevented between the first cavity 101 and the second cavity 102.

The leadframe 103 may furthermore comprise a plurality of pin connectors 116 that may be connected to a circuit board (e.g. by solder reflow). With the pin connectors 116 data may be transmitted from or to the circuit board from or to the leadframe 103. The leadframe (in particular the leadframe footprint) may be standardized by a so-called "SOIC" standard. The amount of pin connectors 116 may thus be standardized by for instance 8 (SOIC 8), 16 (SOIC 16), 24 (SOIC 24) or 32 (SOIC 32).

Moreover, the first cavity 101 and/or the second cavity 102 may be filled with a transparent material. The transparent material may be, for instance, an optical resin or a silicon gel. Thus, the leadframe 103, the driver circuit 106 and the electrooptical elements 104, 105 may be protected from outside influences. A cap element 107 may be attached to the premolded casing 110. The cap element 107 may comprise a first retainer 108 and a second retainer 109. To the first retainer 108, the first waveguide 111 may be attached, and to the second retainer 109, the second waveguide 112 may be attached. The first retainer 108 and the second retainer 109 are adapted for retaining the first waveguide 111 and the second waveguide 112 in a predetermined position with respect to the first and second cavities 101, 102 and with respect to the first electrooptical element 104 and second electrooptical element 105. Additionally, a ferrule 115 may be attached to an end of the first waveguide 111 and the second waveguide 112 in order to improve the connection between the waveguides 111, 112 to the retainers 108, 109.

The first retainer 108 and/or the second retainer 109 may be geometrically coded, or keyed, so that only a predefined and predetermined waveguide 111, 112 may be attached to the retainers 108, 109. Hence, the first retainer 108 may comprise a first diameter D1 and the second retainer 109 may comprise a second diameter D2. Thus, only the waveguide 111, 112 and/or the ferrule 115 that matches to the first diameter D1 or the second diameter D2 may be fixed to the optoelectronic surface mount. To improve the geometrical coding, the first retainer 108 and/or the second retainer 109 may comprise a flaring 114 (bead) mounted to the inside of the cylindrical first retainer 108 and/or second retainer 109. Thus, only a connection device of the waveguide 111, 112, in particular its ferrule 115, may be connected to the respective retainer 108, 109 that fits together with the flaring 114. Thus, a fail connection of the fibres 111, 112 to the optoelectronic surface-mounted device 100 may be prevented so that even an unskilled person may operate the optoelectronic surface-mounted device 100.

Furthermore, the cap element 107 may comprise a lens element 113. The lens element 113 may be interposed between an end of the first waveguide 111 or an end of the second waveguide 112 and the first electrooptical element 104 or the second electrooptical element 105. In other words, the lens may be interposed in the first electromagnetic radiation path and/or the second electromagnetic radiation path. Thus, a light transmission between the electrooptical elements 104, 105 and the waveguides 111, 112 may be improved. The lens 113 may furthermore be in contact with the transparent material inside the first cavity 101 and/or the second cavity 102, so that by the physical contact an index matching with the lens 113 and the transparent material may be provided. Thus, the loss of light intensity between the waveguide 111, 112 and the electrooptical elements 104, 105 may be reduced. By the configuration and construction of the shown optoelectronic surface-mounted device (package) 100 the optoelectronic surface-mounted device 100 may be attached to a circuit board by the SMD method without applying the through-hole technology.

Furthermore, the present optoelectronic surface-mounted device 100 may provide by a fast and incomplex production method. The leadframe 103 may be enveloped by the premolded casing 110 comprising the first cavity 101 and the second cavity 102. The premolded casing 110 may consist of a thermoplastic (resin) or a thermosetting moulding material, so that an optical crosstalk between the first cavity 101 and the second cavity 102 may be prevented.

The first electrooptical element 104 and the second electrooptical element 105 may be mounted to the leadframe 103 that is already embedded in the premolded casing. The first electrooptical element 104 and the second electrooptical element 105 may be attached to the leadframe 103 through the first cavity 101 and/or the second cavity 102. Furthermore, also the driver circuit 106 may be attached to the leadframe 103 through the first cavity 101 and/or the second cavity 102 after moulding the premolded casing 110 around the leadframe 103. The driver circuit 106 may then be connected at least to one of the first electrooptical element 104 and/or the second electrooptical element 105. For protecting the electrooptical elements 104, 105 and the driver circuit 106 and the leadframe 103 from outer influences, a transparent material may be injected in the first cavity 101 and/or the second cavity 102. The transparent material may consist for instance of silicon or silicone gel.

The first cavity 101 and the second cavity 102 may be covered by the cap element 107 having the first retainer 108 and the second retainer 109. The cap 107 and its first retainers 108, 109 may be exchangeable, so that the sizes and geometrical characteristics of the retainers 108, 109 may be adaptable to a variety of different connection standards and to a variety of different needs of different customers. Thus, a flexible optoelectronic surface-mounted device 100 may be provided.

Figure 2:
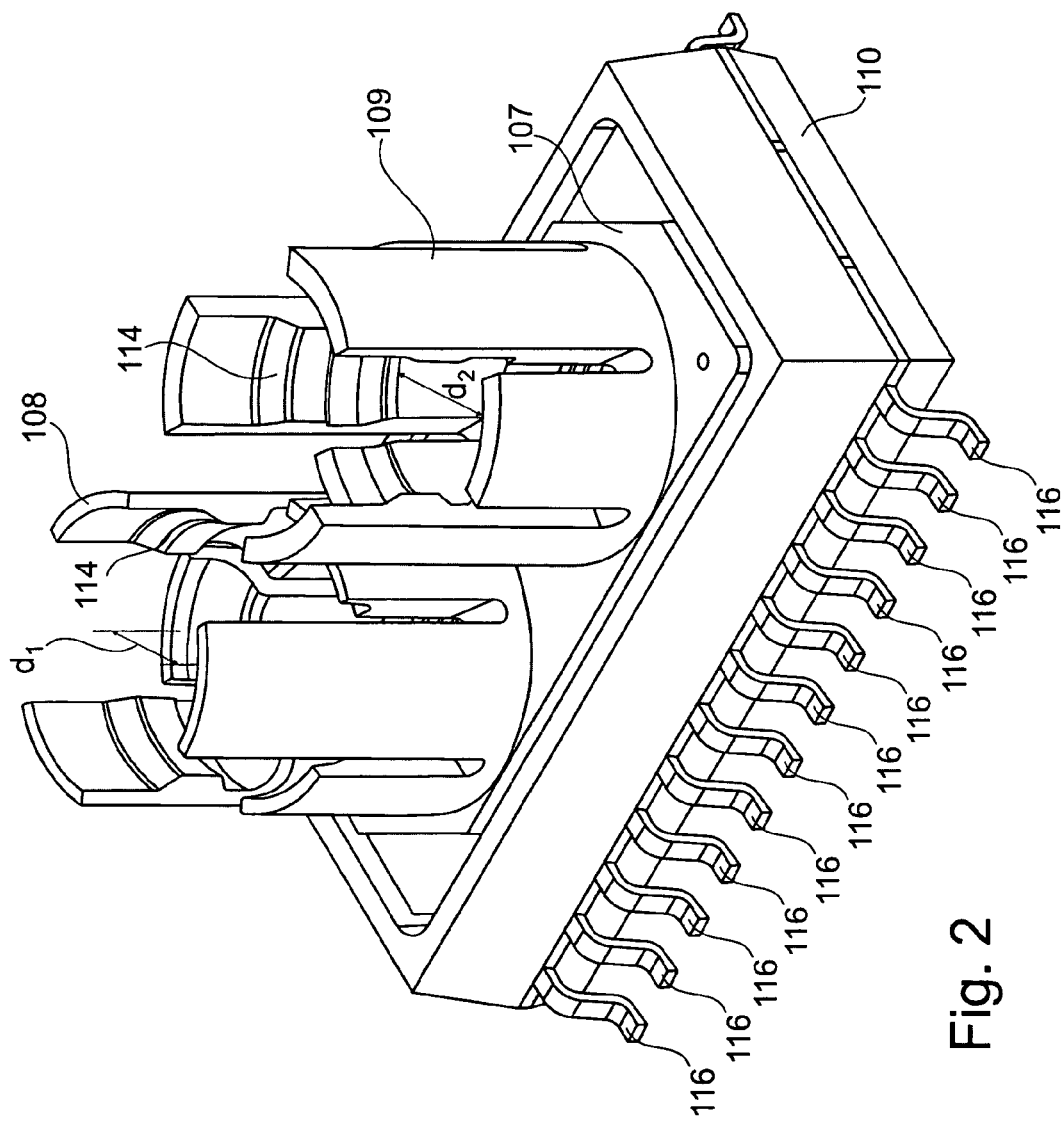
FIG. 2 illustrates a perspective view of an exemplary embodiment of the optoelectronic surface-mounted device.

FIG. 2 illustrates a perspective general view of an illustrative embodiment of the optoelectronic surface-mounted device 100. FIG. 2 illustrates the connector pins 116 that are adapted for connecting the leadframe 103 to a circuit board. Furthermore, the cap element 107 is shown which comprises the first retainer 108 and the second retainer 102. The first retainer 108 and the second retainer 109 are geometrically coded, for instance by different first diameters D1 and second diameters D2 and by beads or flaring 114 that are located at different position insider the retainers 108, 109. Thus, only the correct connectors of waveguides 112, 113 may be connected to the dedicated first retainer 108 and/or second retainer 109.

In accordance with the illustrative embodiment shown in FIGS. 1 and 2, the optoelectronic surface-mounted device is provided that has a leadframe 103 that is already premolded by a premolded casing 110. During molding, two cavities, namely the first cavity 101 and the second cavity 102, may be provided through which first electrooptical elements 103 and second electrooptical elements 104 may be installed (glued, wire bonded) to the leadframe 103. The electrooptical elements 104, 105 may comprise electromagnetic radiation sources and/or detectors for a transmitted radiation. For each first cavity 101 and second cavity 102 a respective first electrooptical element 104 and second electrooptical element 105 may be provided so that no optical crosstalk between the other respective first electrooptical element 104 and second electrooptical element 105 occur.

A cap element 107 may be attached to the premolded casing 110. The cap element 107 comprises first retainers 108 and second retainers 109. Each of the first retainers 108 and second retainers 109 may receive a first waveguide 111 and a second waveguide 112. Each of the waveguides 111, 112 may comprise a ferrule 115 with which a press-fit connection or a bayonet fixation with the retainers 108, 109 may be provided. On one side of the cap element 107 that is directed to the electrooptical elements 104, 105 lenses may be attached. The lenses may be molded to the cap element 107 and may consist of silicone gel, for instance.

It should be noted that the term "comprising" does not exclude other elements or features and the "a" or "an" does not exclude a plurality. Also, elements described in association with different embodiments may be combined. It should be noted that the invention has been described with reference to a few illustrative embodiments for the purpose of demonstrating the principles and concepts of the invention. It will be understood by persons of ordinary skill in the art, in view of the description provided herein, that many modifications can be made to the embodiments described herein without deviating from the scope of the invention. To the contrary, all such modifications are within the scope of the invention, as will be understood by persons of ordinary skill in the art in view of the description provided herein.

What is claimed is:

1. An optoelectronic surface-mounted device, the optoelectronic surface-mounted device comprising:
    a premolded casing having a first cavity and a second cavity;
    a first electrooptical element and a second electrooptical element;
    a cap element attached to the premolded casing, the cap element having a first retainer and a second retainer formed therein, the first and second retainers each having at least one mating feature formed therein that is configured to interlock with at least one respective mating feature formed on first and second optical waveguide termination devices disposed on ends of first and second optical waveguides, respectively, wherein the first and second retainers are aligned with the first and second cavities, respectively, such that when the first and second optical waveguide termination devices are interlocked with the first and second retainers, respectively, the ends of the first and second optical waveguides secured to the first and second termination devices are positioned over the first and second cavities, respectively; and
    a leadframe to which the first electrooptical element and the second electrooptical element are mounted, wherein the leadframe is embedded in the premolded casing, and wherein the first cavity is adapted for providing a first electromagnetic radiation path between the first optical waveguide and the first electrooptical element, and wherein the second cavity is adapted for providing a second electromagnetic radiation path between the second optical waveguide and the second electrooptical element, and wherein at least a portion of the premolded casing disposed between the first and second cavities comprises a material that is opaque to a wavelength of electromagnetic radiation to be propagated alone the first and second electromagnetic radiation paths to decouple electromagnetic radiation propagating along the first electromagnetic radiation path from electromagnetic radiation propagating along the second electromagnetic radiation path.

2. The optoelectronic surface-mounted device of claim 1, wherein the entire premolded casing is formed of an opaque material.

3. The optoelectronic surface-mounted device of claim 1, wherein the first cavity and the second cavity are filled with a transparent material.

4. The optoelectronic surface-mounted device of claim 1, further comprising:
    a driver circuit, wherein the driver circuit is connected to the leadframe and at least connected to one of the first electrooptical element and the second electrooptical element for driving the at least one of the first electrooptical element and the second electrooptical element.

5. The optoelectronic surface-mounted device of claim 1, wherein at least one of the first electrooptical element and the second electrooptical element is selected from the group consisting of electromagnetic radiation sources and electromagnetic radiation detectors.

6. The optoelectronic surface-mounted device of claim 1, further comprising:
    a lens element, wherein the lens element is mounted at least to one of the first retainer and the second retainer.

7. The optoelectronic surface-mounted device of claim 6, wherein the lens element is adapted for being mounted at least to one of the first retainer and the second retainer by injecting molding.

8. The optoelectronic surface-mounted device of claim 6, wherein the lens element is mounted at least to one of the first retainer and the second retainer so that the lens element extends into one of the first cavity and the second cavity.

9. The optoelectronic surface-mounted device of claim 1, wherein the first retainer and the second retainer are shape coded to provide the at least one mating feature of the first and second retainers.

10. The optoelectronic surface-mounted device of claim 1, wherein at least one of the first and second optical waveguide termination devices is selected from a group of optical waveguide termination devices consisting of snap fit connectors and bayonet nut connectors, and wherein the at least one mating feature formed in at least one of the first retainer and the second retainer is configured to mate with the optical waveguide termination device selected from the group.

11. The optoelectronic surface-mounted device of claim 1, wherein the leadframe comprise a footprint selected from one of the group consisting of SOIC 8 footprints, SOIC 16 footprints, SOIC 24 footprints and SOIC 32 footprints.

12. A method of forming an optoelectronic surface-mounted device, the method comprising:
  providing a premolded casing having a first cavity and a second cavity;
  mounting a leadframe to a first electrooptical element and a second electrooptical element;
  embedding the leadframe in the premolded casing;
  providing a first electromagnetic radiation path between a first waveguide and the first electrooptical element;
  providing a second electromagnetic radiation path between a second waveguide and the second electrooptical element; and
  attaching a cap element to the premolded casing, the cap element having a first retainer and a second retainer formed therein, the first and second retainers each having at least one mating feature formed therein that is configured to interlock with at least one respective mating feature formed on first and second optical waveguide termination devices disposed on ends of first and second optical waveguides, respectively, wherein the first and second retainers are aligned with the first and second cavities, respectively, such that when the first and second optical waveguide termination devices are interlocked with the first and second retainers, respectively, the ends of the first and second optical waveguides having the first and second termination devices disposed thereon are positioned over the first and second cavities, respectively, and
  wherein at least a portion of the premolded casing that is disposed between the first and second cavities comprises a material that is opaque to a wavelength of electromagnetic radiation to be propagated along the first and second electromagnetic radiation to decouple electromagnetic radiation propagating along the first electromagnetic radiation path from electromagnetic radiation propagating along the second electromagnetic radiation path.

* * * * *